United States Patent
Krishnan et al.

(10) Patent No.: US 8,241,981 B1
(45) Date of Patent: Aug. 14, 2012

(54) METHOD OF FABRICATING A DEEP TRENCH (DT) METAL-INSULATOR-METAL (MIM) CAPACITOR

(75) Inventors: Rishikesh Krishnan, Poughkeepsie, NY (US); Joseph F. Shepard, Jr., Poughkeepsie, NY (US); Michael P. Chudzik, Danbury, CT (US); Christian Lavoie, Ossining, NY (US); Dong-Ick Lee, Fishkill, NY (US); Oh-Jung Kwon, Hopewell Junction, NY (US); Unoh Kwon, Fishkill, NY (US); Youngjin Choi, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/017,108

(22) Filed: Jan. 31, 2011

(51) Int. Cl.
*H01L 21/8242* (2006.01)

(52) U.S. Cl. ........ 438/243; 438/239; 438/241; 438/386; 438/E21.646

(58) Field of Classification Search .......... 438/238–239, 438/243–246, 270, 589; 257/301, 330, 304–305
See application file for complete search history.

(56) References Cited

U.S. PATENT DOCUMENTS

| | | |
|---|---|---|
| 6,410,399 B1 | 6/2002 | Flaitz et al. |
| 6,566,177 B1 | 5/2003 | Radens et al. |
| 7,276,751 B2 | 10/2007 | Ho et al. |
| 7,564,086 B2 | 7/2009 | Kwon et al. |
| 7,682,896 B2 | 3/2010 | Ho et al. |
| 7,741,188 B2 * | 6/2010 | Dyer et al. .......... 438/386 |
| 7,750,388 B2 | 7/2010 | Ho et al. |

* cited by examiner

*Primary Examiner* — Dung A. Le
(74) *Attorney, Agent, or Firm* — Joseph P. Abate (57) ABSTRACT

A method includes providing an SOI substrate including a layer of silicon disposed atop a layer of an oxide, the layer of an oxide being disposed atop the semiconductor substrate; forming a deep trench having a sidewall extending through the layer of silicon and the layer of an oxide and into the substrate; depositing a continuous spacer on the sidewall to cover the layer of silicon, the layer of an oxide and a part of the substrate; depositing a first conformal layer of a conductive material throughout the inside of the deep trench; creating a silicide within the deep trench in regions extending through the sidewall into an uncovered part of the substrate; removing the first conformal layer from the continuous spacer; removing the continuous spacer; depositing a layer of a high k dielectric material throughout the inside of the deep trench, and depositing a second conformal layer of a conductive material onto the layer of a high-k dielectric material.

17 Claims, 9 Drawing Sheets

| TECHNOLOGY | DT CD (BOTTLED) | DT DEPTH | EOT | CAPACITANCE TARGET | DIELECTRIC |
|---|---|---|---|---|---|
| 22nm | 110nm (TOP)/ 65nm (BOTTOM) | 3500nm | 25.5A | 12fF | HfO |
| 15nm | 85nm (TOP)/ 55nm (BOTTOM) | 2700nm | 21.5A | 9.5fF | HfSiOx (MIS) |
| 15nm | 85nm (TOP)/ 55nm (BOTTOM) | 1500nm | 12A | 9.5fF | HfSiOx (MIM) |

FIG. 4

METHOD OF FABRICATING A DEEP TRENCH (DT) METAL-INSULATOR-METAL (MIM) CAPACITOR

FIELD OF THE INVENTION

The invention relates to semiconductor devices and, more particularly to deep trench (DT) capacitors such as for dynamic random access memory (DRAM), including embedded DRAM (eDRAM).

BACKGROUND OF THE INVENTION

A memory cell in an integrated circuit (IC) may include a transfer device such as a transistor and an associated capacitor. The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET). The capacitor, which is typically formed in a portion of a trench, consists of a pair of conductive plates (electrodes), which are separated from each other by a node dielectric material. Information or data is stored in the memory cell in the form of charge accumulated on the capacitor. Because capacitors leak charge (generally, a capacitor is only useful for temporarily storing an electrical charge), the information (data) eventually fades unless the capacitor charge is refreshed (read, and re-written) periodically, such as every 64 ms (milliseconds).

DRAM (eDRAM)

Generally, the DRAM cells discussed herein comprise a capacitor formed in a deep trench (DT) in a substrate, and an "access transistor" formed on the surface of the substrate adjacent and atop the capacitor. The capacitor ("DT capacitor") generally comprises a first conductive electrode called the "buried plate" which is a heavily doped region of the substrate surrounding the trench, a thin layer of insulating material such as an oxide lining the trench, and a second conductive electrode such as a heavily doped polycrystalline plug (or "node") disposed within the trench. The transistor may comprise a FET having one of its source/drain (S/D) terminals connected to (or an extension of) the second electrode (node) of the capacitor.

Figure 1:
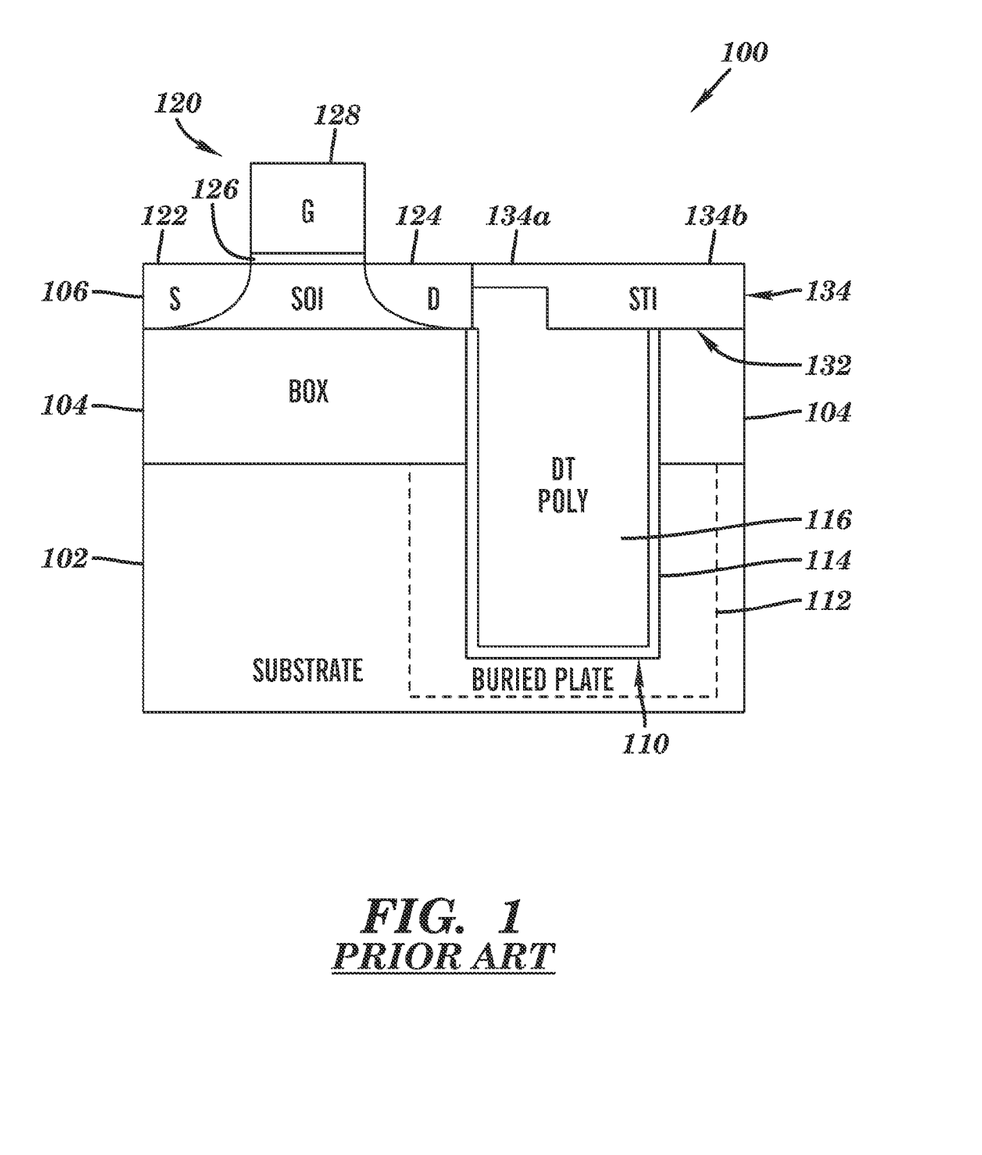
FIG. 1 is a cross-sectional view of a DRAM cell 100 and a FET 120, according to the prior art.

FIG. 1 illustrates a DRAM cell 100 of the prior art, and generally comprising an access transistor and an associated cell capacitor. The DRAM cell is generally formed (created), as follows.

Beginning with a semiconductor substrate 102, a deep trench (DT) 110 is formed, extending into the substrate 102, from a top (as viewed) surface thereof. The substrate 102 may comprise a SOI substrate having a layer 106 of silicon (SOI) on top of an insulating layer 104 which is atop the underlying silicon substrate 102. The insulating layer 104 typically comprises buried oxide (BOX). The deep trench (DT) 110 is used for forming the cell capacitor (or "DT capacitor"), as follows. The trench 110 may have a width of about 50 nm to 200 nm and a depth of 1000 nm to 10000 nm, by way of example.

The cell capacitor generally comprises a first conductor called the "buried plate" which is a heavily doped region 112 of the substrate surrounding the trench 110, a thin layer 114 of an insulating material lining the trench 110, and a second conductor 116 such as a heavily doped polycrystalline plug (or "node", "DT poly") disposed within the trench 110. A cell transistor ("access transistor") 120 may comprise a FET having one of its source/drain (S/D) terminals connected to (or an extension of) the second conductor (node) of the capacitor, as follows.

The FET 120 comprises two spaced-apart diffusions 122, 124, within the surface of the substrate 102—one of which will serve as the "source" and the other of which will serve as the "drain" (D) of the transistor 120. The space between the two diffusion areas is called the "channel" (and is approximately where the legend "SOI" appears). A thin dielectric layer 126 is disposed on the substrate above the channel, and a "gate" structure (G) 128 is disposed over the dielectric layer 126, thus also atop the channel. (The dielectric under the gate is also commonly referred to as "gate oxide" or "gate dielectric".) The gate 128 may be a portion of an elongate wordline (WL).

In modern CMOS technology, a shallow trench isolation (STI) is commonly used to isolate one (or more) transistors from other transistors, for both logic and memory. As shown in FIG. 1, a shallow trench 132 may be formed, surrounding the access transistor 120 (only one side of the transistor is shown). Note that the trench 132 extends over the DT (node) poly 116, a top portion of which is adjacent the drain (D) of the transistor 120. Therefore, the trench 132 is less deep (thinner) over the DT poly 116 and immediately adjacent the drain (D) of the transistor 120, and may be deeper (thicker) further from the drain (D) of the transistor 120 (and, as shown, over top portion of the DT poly 116 which is distal from (not immediately adjacent to) the drain (D) of the transistor 120.

The STI trench 132 may be filled with an insulating material, such as oxide (STI oxide) 134. Because of the thin/thick trench geometry which has been described, the STI oxide will exhibit a thin portion 134a where it is proximal (adjacent to) the drain (D) of the transistor 120, and a thicker portion 134b where it is distal from (not immediately adjacent to) the drain (D) of the transistor 120.

Although not shown, the deep trench (DT) may be "bottle-shaped", such that it is wider in the substrate under the BOX, and a thinner bottleneck portion of the trench extends through the BOX (and overlying SOI, not shown). The deep trench is typically filled with poly (DT Poly, compare 116), there is a lining of insulator (compare 114), and the trench is surrounded by the buried plate (compare 112). This forms the deep trench capacitor, which is generally not limited to SOI.

Figure 2:
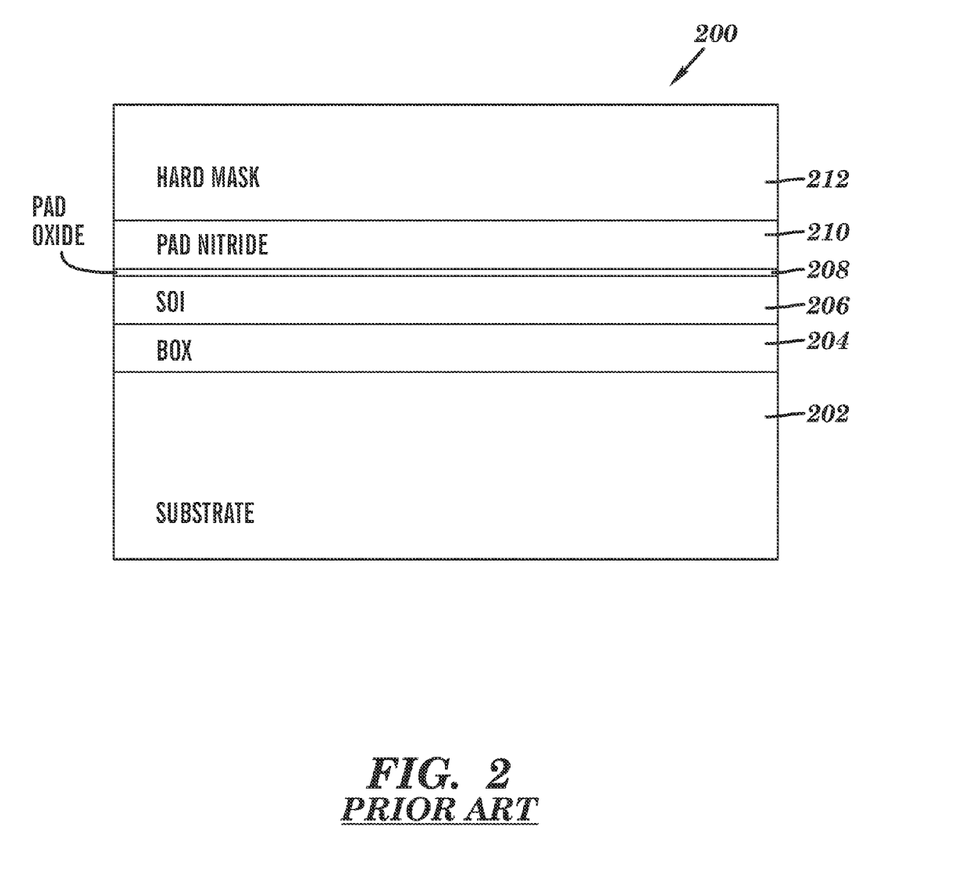
FIG. 2 is a cross-sectional view of an SOI substrate, according to the prior art.

FIG. 2 illustrates an SOI substrate 200 with pad films and a hard mask, according to the prior art.

The overall substrate 200 is an SOI-type substrate having a layer 206 of silicon ("SOI") atop a buried oxide (BOX, insulator) layer 204, which is atop an underlying substrate 202 which may be a silicon substrate. The BOX layer 204 may have a thickness of 500-2500 Å (50-250 nm). The silicon (SOI) layer 206 may have a thickness of 50-200 Å (5-20 nm).

Pad films comprising a layer 208 of an oxide and a layer 210 of a nitride are disposed atop the SOI layer 206. The pad oxide layer 208 may have a thickness of 10-20 Å (1-2 nm), and the pad nitride layer 210 may have a thickness of 400-1500 Å (40-150 nm).

SOI Substrates

Silicon-on-insulator technology (SOI) typically refers to the use of a layered silicon-insulator-silicon substrate in place of a more conventional silicon substrate (Bulk Substrate) in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

SiO2-based SOI substrates (or wafers) can be produced by several methods:

SIMOX—Separation by IMplantation of OXygen—uses an oxygen ion beam implantation process followed by high temperature annealing to create a buried SiO2 layer.

Wafer Bonding—the insulating layer is formed by directly bonding oxidized silicon with a second substrate. The majority of the second substrate is subsequently removed, the remnants forming the topmost Si layer.

Seed methods—wherein the topmost Si layer is grown directly on the insulator. Seed methods require some sort of template for homoepitaxy, which may be achieved by chemical treatment of the insulator, an appropriately oriented crystalline insulator, or vias through the insulator from the underlying substrate.

Glossary

Unless otherwise noted, or as may be evident from the context of their usage, any terms, abbreviations, acronyms or scientific symbols and notations used herein are to be given their ordinary meaning in the technical discipline which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (™).

| | |
|---|---|
| ALD | short for atomic layer deposition. ALD is a gas phase chemical process used to create extremely thin coatings. The majority of ALD reactions use two chemicals, typically called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually 1-500 nm. ALD can be used to deposit several types of thin films, including various ceramics, from conductors to insulators. |
| anisotropic | literally, one directional. An example of an anisotropic process is sunbathing. Only surfaces of the body exposed to (facing in the direction of) the sun become tanned. Anisotropic means "not the same in all directions" or "not isotropic". See isotropic. |
| capacitor | A capacitor is a two-terminal device (electrical or electronic component) that can store energy in the electric field between a pair of conductive electrodes (called "plates"). The process of storing energy in the capacitor is known as "charging", and involves electric charges of equal magnitude, but opposite polarity, building up on each plate. |
| CMP | short for chemical-mechanical polishing. CMP is a process, using both chemicals and abrasives, comparable to lapping (analogous to sanding), for removing material from a built up structure. For example, after depositing and etching a number of elements, the top surface of the resulting structure may very uneven, needing to be smoothed (or levelled) out, prior to performing a subsequent process step. Generally, CMP will level out the high spots, leaving a relatively smooth planar surface. |
| CVD | short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication. |
| deposition | Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate. |
| dielectric | A dielectric is a non-conducting material or substance. (A dielectric is an electrical insulator.) Some dielectrics commonly used in semiconductor technology are SiO2 ("oxide") and Si3N4 ("nitride"). The insulating quality of a dielectric may be characterized by "k", the dielectric constant. Generally, the higher the "k", the better the insulating quality of the dielectric. Oxide, for example, has a k of approximately 3.9. A class of materials, referred to as "high-k" (or "high-K") dielectrics, have a dielectric constant higher than that of oxide (k > 3.9). |
| dopant | element introduced into semiconductor to establish either p-type (acceptors) or n-type (donors) conductivity; common dopants in silicon: for p-type - boron (B), Indium (In); for n-type - phosphorous (P) arsenic (As), antimony (Sb). Dopants are of two types - "donors" and "acceptors". N type implants are donors and P type are acceptors. |
| doping | doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant). Usually in doping, a dopant, a dosage and an energy level are specified and/or a resulting doping level may be specified. A dosage may be specified in the number of atoms per $cm^2$ and an energy level (specified in keV, kilo-electron-volts), resulting in a doping level (concentration in the substrate) of a number of atoms per $cm^3$. The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter (cm3) of water. An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$. ("/$cm^3$" may also be written "$cm^{-3}$" |
| DRAM | short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static metnory. Its advantage over SRAM is its structural simplicity: only one transistor and a capacitor are required per bit, compared to six transistors in SRAM. This DRAM to reach very high |

| | |
|---|---|
| eDRAM | density. Like SRAM, it is in the class of volatile memory devices, since it loses its data when the power supply is removed.<br>short for embedded DRAM. eDRAM is a capacitor-based dynamic random access memory usually integrated on the same die or in the same package as the main ASIC or processor, as opposed to external DRAM modules and transistor-based SRAM typically used for caches. |
| etching | etching generally refers to the removal of material from a substrate (or structures formed on the substrate), and is often performed with a mask in place so that material may selectively be removed from certain areas of the substrate, while leaving the material unaffected. in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. |
| FET | short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G). |
| HTO | A High Temperature Oxide (HTO) is typically prepared by a rapid thermal CVD process involving SiH4, Si2H6, and an oxidizer such as NO, N2O or O2. |
| isotropic | literally, identical in all directions. An example of an isotropic process is dissolving a tablet in water. All exposed surfaces of the tablet are uniformly acted upon. (see "anisotropic") |
| lithography | In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. |
| mask | The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." |
| metallization | Metallization refers to formation of metal contacts and interconnects in the manufacturing of semiconductor devices. This generally occurs after the devices are completely formed, and ready to be connected with one another. A first level or layer of metallization is usually referred to as "M1." |
| nitride | commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask (HM). |
| n-type | semiconductor in which concentration of electrons is higher than the concentration of "holes". See p-type. |
| oxide | commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example. |
| plasma etching | Plasma etching refers to dry etching in which semiconductor wafer is immersed in plasma containing etching species; chemical etching reaction is taking place at the same rate in any direction, i.e. etching is isotropic; can be very selective; used in those applications in which directionality (anisotropy) of etching in not required, e.g. in resist stripping. |
| poly | short for polycrystalline silicon (Si). Heavily doped poly Si is commonly used as a gate contact in silicon MOS and CMOS devices; |
| p-type | semiconductor in which concentration of "holes" is higher than the concentration of electrons. See n-type. Examples of p-type silicon include silicon doped (enhanced) with boron (B), Indium (In) and the like. |
| resist | short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material. |
| RIE | short for Reactive Ion Etching. RIE is a variation of plasma etching in which during etching, the semiconductor wafer is placed on an RF powered electrode. The plasma is generated under low pressure (vacuum) by an electromagnetic field. It uses chemically reactive plasma to remove material deposited on wafers. High-energy ions from the plasma attack the wafer surface and react with it. The wafer takes on potential which accelerates etching species extracted from plasma toward the etched surface. A chemical etching reaction is preferentially taking place in the direction normal to the surface—in other words, etching is more anisotropic than in plasma etching but is less selective. RIE typically leaves the etched surface damaged. RIE is a very common etching mode in semiconductor manufacturing. |
| Self-Align | As used herein "self-align" means that specific surfaces of the metallized (silicided) bottom electrode extend controllable distances into the silicon substrate in the deep trench. An inherent advantage of a self aligned fabrication process according to the present invention is that the metallized bottom electrode is not formed in undesirable locations of the capacitor such as in the vertical walls of the buried oxide (BOX) and the silicon (SOI). |
| Si | Silicon, a semiconductor. |
| SI units | The International System of Units (abbreviated SI from the French Le Système international d'unités) is the modern form of the metric system and is generally a system devised around the convenience of the number 10. It is the world's most widely used system of units, both in everyday commerce and in science. The SI system of units consists of a set of units together with a set of prefixes. There are seven "base units", which are meter (abbreviated "m", for length), kilogram (abbreviated "kg", for mass), second (abbreviated "s", for time), Ampere (abbreviated "A", for electric current), Kelvin (abbreviated "K", for thermodynamic temperature), mole (abbreviated "mol", for the amount of a substance) and candela (abbreviated "cd", for luminous intensity). A prefix may be added to the units to produce a multiple of the original unit. All multiples are integer powers of ten. For example, "kilo" denotes a multiple of a thousand and "milli" denotes a multiple of one-thousandth. Hence there are one thousand millimeters to the meter and one thousand meters to the kilometer. |
| SOI | short for silicon-on-insulator. Silicon on insulator (SOI) technology refers to the use of a layered silicon-insulator-silicon substrate in place of a conventional silicon substrate in semiconductor manufacturing, especially microelectronics, SOI-based devices differ from |

|   |   |
|---|---|
|   | conventional silicon-built devices in that the silicon junction is above an electrical insulator, typically silicon dioxide or (less commonly) sapphire. |
| STI | short for shallow trench isolation. Generally, a trench etched into the substrate and filled with an insulating material such as oxide, to isolate one region of the substrate from an adjacent region of the substrate. One or more transistors of a given polarity may be disposed within an area isolated by STI. |
| substrate | typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD). |
| transistor | A transistor is a semiconductor device, commonly used as an amplifier or an electrically controlled switch. The transistor is the fundamental building block of the circuitry in computers, cellular phones, and all other modern electronic devices. Because of its fast response and accuracy, tile transistor is used in a wide variety of digital and analog functions, including amplification, switching, voltage regulation, signal modulation, and oscillators. Transistors may be packaged individually or as part of an integrated circuit, some with over a billion transistors in a very small area. See FET. |
| Units of Length | Various units of length may be used herein, as follows: |
| meter (m) | A meter is the SI unit of length, slightly longer than a yard. 1 meter = ~39 inches. 1 kilometer (km) = 1000 meters = ~0.6 miles. 1,000,000 microns = 1 meter. 1,000 millimeters (mm) = 1 meter. 100 centimeters (cm) = 1 meter. |
| micron (μm) | one millionth of a meter (0.000001 meter); also referred to as a micrometer. |
| mil | $1/1000$ or 0.001 of an inch; 1 mil = 25.4 microns. |
| nanometer (nm) | one billionth of a meter (0.000000001 meter). |
| Angstrom | (Å) one tenth of a billionth of a meter. 10 Å = 1 nm. |
| V | short for voltage. Different voltages may be applied to different parts of a transistor or memory cell to control its operation. |
| wafer | In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111). |
| work function | The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal. |

SUMMARY OF THE INVENTION

It is a general object of the present invention to provide an improved technique for forming DT capacitors in SOI substrates.

This invention describes and teaches how to make a metal-insulator-metal (MIM) deep trench capacitor for use, for example, in DRAM (including eDRAM) applications. The metal for each of the plate and the node may consist essentially of a respective thin layer of Ti or titanium nitride (TiN), using atomic layer deposition (ALD). (ALD deposition is the enabling method for getting the thin conformal metal and dielectric films into the deep trench.) The plate may be deposited on arsenic (As) doped silicon, but the doping of the silicon may not be required. deep trench capacitor for use, for example, in DRAM (including eDRAM) applications. The metal for each of the plate and the node may consist essentially of a respective thin layer of Ti or titanium nitride (TIN), using atomic layer deposition (ALD). (ALD deposition is the enabling method for getting the thin conformal metal and dielectric films into the deep trench.) The plate may be deposited on arsenic (As) doped silicon, but the doping of the silicon may not be required.

According to an embodiment of the invention, a continuous side wall spacer is disposed within the deep trench to protect the sides of the SOI and Box from silicidation effects resulting from subsequent processing steps. The inventors believe a further advantage is that the inventive method also results in self-alignment and uses only a low number of process steps to achieve self-alignment.

According to the preferred embodiment of the invention, the method includes providing an SOI substrate including a layer of silicon disposed atop a layer of an oxide, the layer of an oxide being disposed atop a semiconductor substrate; forming a deep trench having a sidewall extending through the layer of silicon and the layer of an oxide and into the semiconductor substrate; depositing a continuous spacer on the sidewall to cover the layer of silicon, the layer of an oxide and a part of the substrate; depositing a first conformal layer of a conductive material throughout the inside of the deep trench; creating a silicide within the deep trench in a region extending through the sidewall into an uncovered part of the substrate; removing the first conformal layer from the continuous spacer; removing the continuous spacer; depositing a layer of a high k dielectric material throughout the inside of the deep trench, and depositing a second conformal layer of a conductive material onto the layer of the high-k dielectric material.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known or conventional processing steps and materials are generally not described in detail.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula SiO2. For example, silicon nitride (stoichiometrically Si3N4, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

As used herein, the term semiconductor fabrication process or semiconductor device may refer to standard CMOS processing and devices. CMOS is a widely used type of semiconductor product, that uses both NMOS (negative polarity) and PMOS (positive polarity) devices and circuits. Generally, unless otherwise stated, the polarities of any device disclosed herein may be reversed, "p" for "n", which may (or may not) require that other associated devices are also implemented with opposite polarity.

Deep Trench (DT) eDRAM

Deep trench eDRAM has to become a standard feature in advanced CMOS technologies. This is largely due to its competitive advantage over SRAM as cache memory. The advantage comes from its greatly increased cell density. The speed requirement for the eDRAM does not have to match SRAM speeds to be competitive, but it should be as fast as possible.

A major challenge with trench eDRAM is etching the trenches deep enough to achieve the required capacitance. A promising way to alleviate the need for deep trenches is to increase the unit area capacitance through the use of a high-k node dielectric. Hafnium Oxide (HfO2, sometimes abbreviated "HFO") is an attractive candidate material due to its very high k value (~23), its thermal stability, and the conformality of ALD deposition that allows it to be deposited in high aspect ratio trenches.

One technical challenge in implementing HFO is the need for an oxide layer between the As-doped silicon buried plate and the HFO deposition. The oxide layer greatly reduces the effective dielectric constant of the composite node dielectric.

In the eDRAM capacitor application, there is a further need to have the work functions of the node and plate conductors matched.

An embodiment of a process of forming a deep trench (DT) metal-insulator-metal (MIM) capacitor will now be described.

Figure 3A:
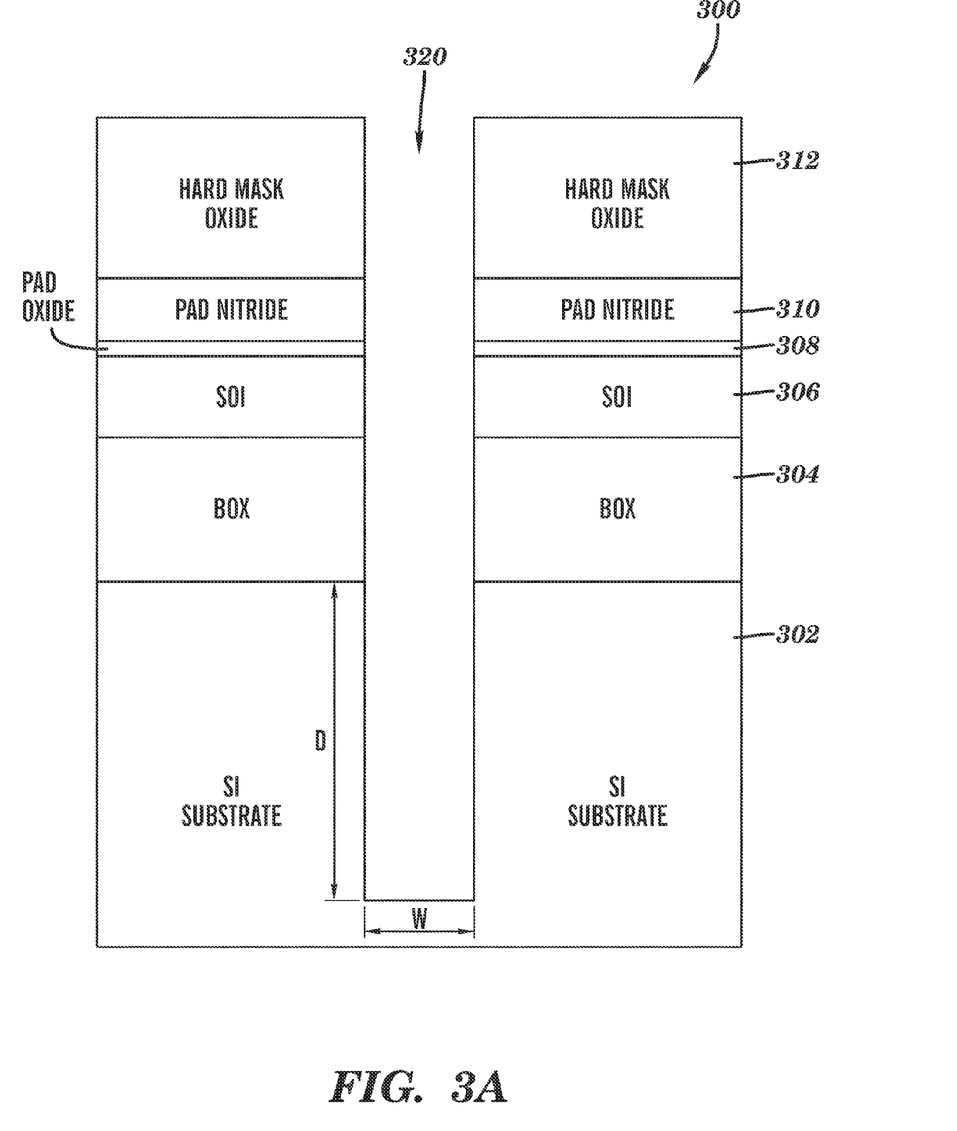
FIGS. 3A-3F are cross-sectional views of a process for forming a DT MIM capacitor, according to an illustrative embodiment of the present invention.

FIG. 3A illustrates a first step (DT silicon RIE) in the process embodiment of creating a DT MIM capacitor. Starting with a standard SOI substrate, such as providing the SOI substrate 200 shown in FIG. 2, a standard deep trench (DT) lithography is performed. Generally, an opening is made in a hard mask (See 212, 312) by a conventional hard mask open RIE process and a subsequent deep trench RIE is performed to form a deep trench 320 extending through the pad nitride 310 (compare 210), pad oxide 308 (compare 208), SOI layer 306 (compare 206), BOX 304 (compare 204) and into the underlying semiconductor substrate 302 (compare 202). After DT etch, the hard mask may remain, or be removed by a conventional process such as a wet strip that typically uses hydrofluoric acid (HF). The trench 320 may be approximately cylindrical.

As shown in FIG. 3A, the deep trench (DT) 320 may have a depth "D" of approximately 1500-approximately (±10%) to approximately 5000 nm (i.e. 1.5-5 microns), a width "W" of approximately 50 nm to approximately 150 nm. The deep trench (DT) is much deeper than it is wide, having (for example) an aspect ratio (D:W) in a range of approximately 25:1 to approximately 40:1.

The "deep trench" or "DT" itself may be considered to be only that part of the overall trench which is within the substrate 302, not including the part of the trench which extends through the BOX 304 and SOI 306 and mask 312, generally because that is where the DT capacitor will be formed. The top part of the overall trench, in the BOX 304 and SOI 306 and mask 312 may be referred to as an extension of the deep trench, or may be included in a reference to the overall trench.

Figure 3B:
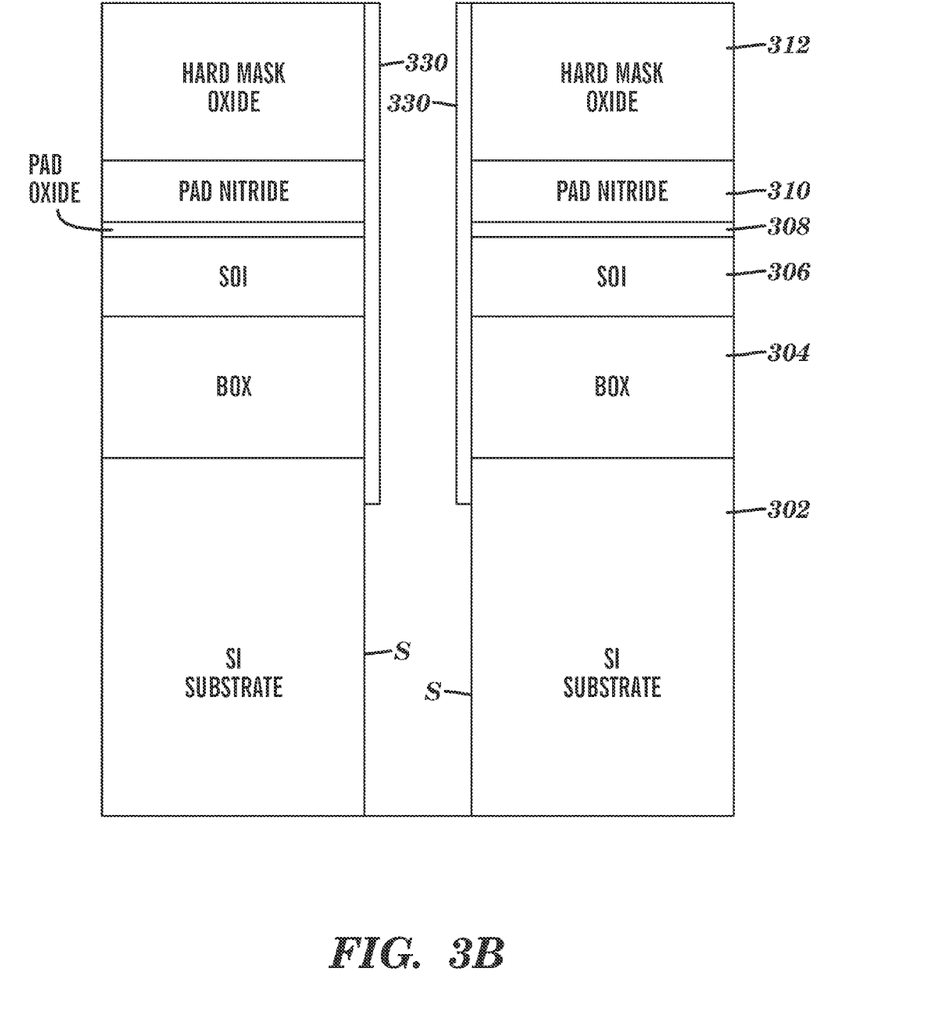

In FIG. 3B, deposit a continuous spacer 330 on the sidewalls inside of the deep trench 320 to cover the complete sides of the layer of silicon 306 and the layer of oxide 304 and partial sides of the silicon substrate 302. The sides S of the substrate 302 remain uncovered. In the FIG. 3B, the complete sides of the pad oxide, pad nitride and hardmask are also covered. The continuous spacer 330 is formed of any of the following materials such as HTO, nitride, HFO, AlO, and is deposited by any conventional technique such as ALD, CVD or PVD. In the embodiment, the spacer 330 has a substantially uniform thickness in a range of approximately 3 nm to approximately 30 nm. The spacer 330 functions primarily to block subsequent siliciding the areas covered by the spacer 330, and protects the sides of the layers 312, 310, 308, 306, 304 and partial sides of the substrate 302.

Figure 3C:
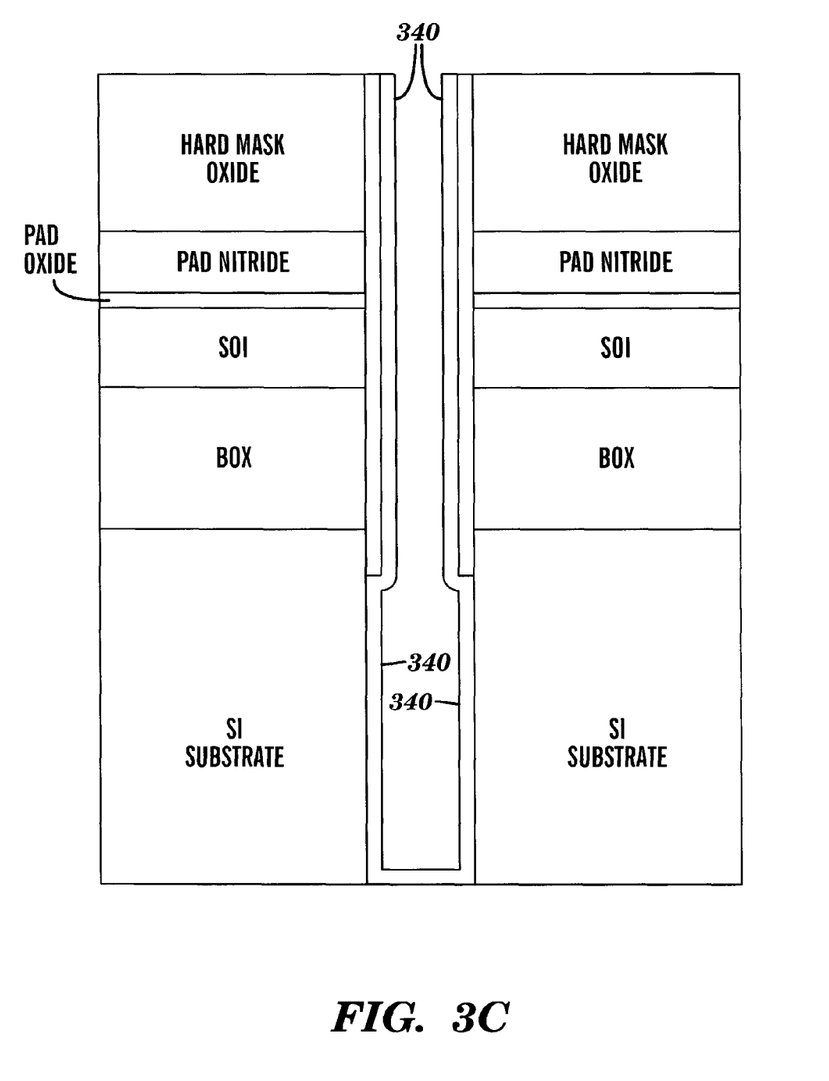

In FIG. 3C, a first conformed layer 340 of a conductive material is deposited throughout the inside of the deep trench 320 and thus on the sides S (FIG. 3B) of the substrate 302 not covered by the continuous spacer 330. This conductive material is, for example, a metal such as Ti, Ni, Co, Pt or Pd, or combinations thereof, and is deposited by any conventional technique such as ALD. The layer 340 has a substantially uniform thickness in a range of approximately 1 nm to approximately 15 nm. The layer 340 thus lines the deep trench and can function as one of the two electrodes for the capacitor being formed in the deep trench 320, thus substituting for the conventional buried plate (FIG. 1) which usually surrounds the trench.

Figure 3D:
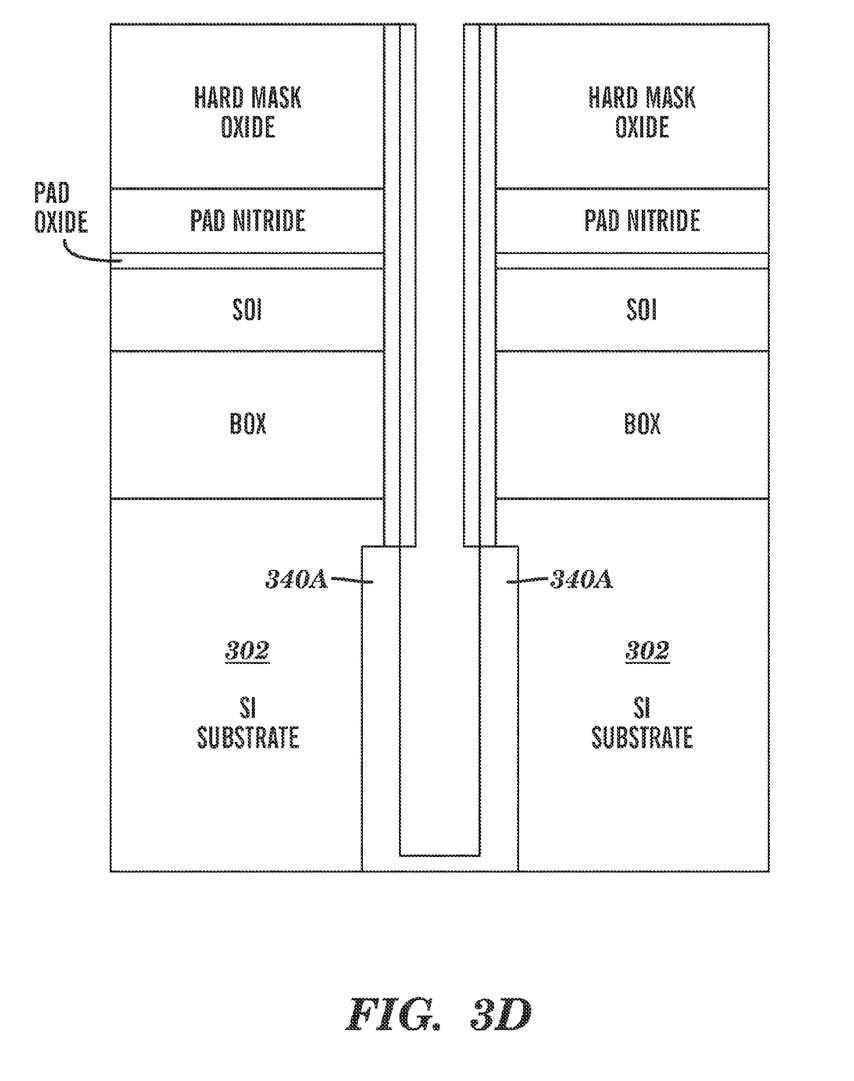

In FIG. 3D, there is shown a result of creating a suicide 340A within the deep trench 320. The silicide extends laterally through the sidewalls S in uncovered parts of the silicon substrate 302 as shown. Creating the silicide can be accomplished by any conventional technique such as a suitable anneal. For example, if the layer 340 is Ti having a 5 nm thickness, then the structure can be annealed at 700° C. for a time period of 30 sec in $N_2$. See, for example, U.S. Pat. No. 6,410,399 B1, issued Jun. 25, 2002, PROCESS TO LOWER STRAP, WORDLINE AND BITLINE CONTACT RESISTANCE IN TRENCH BASED DRAMS B SILICIDIZATION, by Flaitz, et al. The metal 340 reacts with the exposed (uncovered) silicon of the substrate 302. In regions where, for example, the Box and SOI are protected by the spacer (eg. HTO), no silicidation occurs. The silicide 340A extends approximately 5 nm laterally (Arrow A) into the Si substrate 302. Thus, the lateral distance between the surface 340B of the silicide and the surface 304B of the BOX is approximately 5 nm.

Figure 3E:
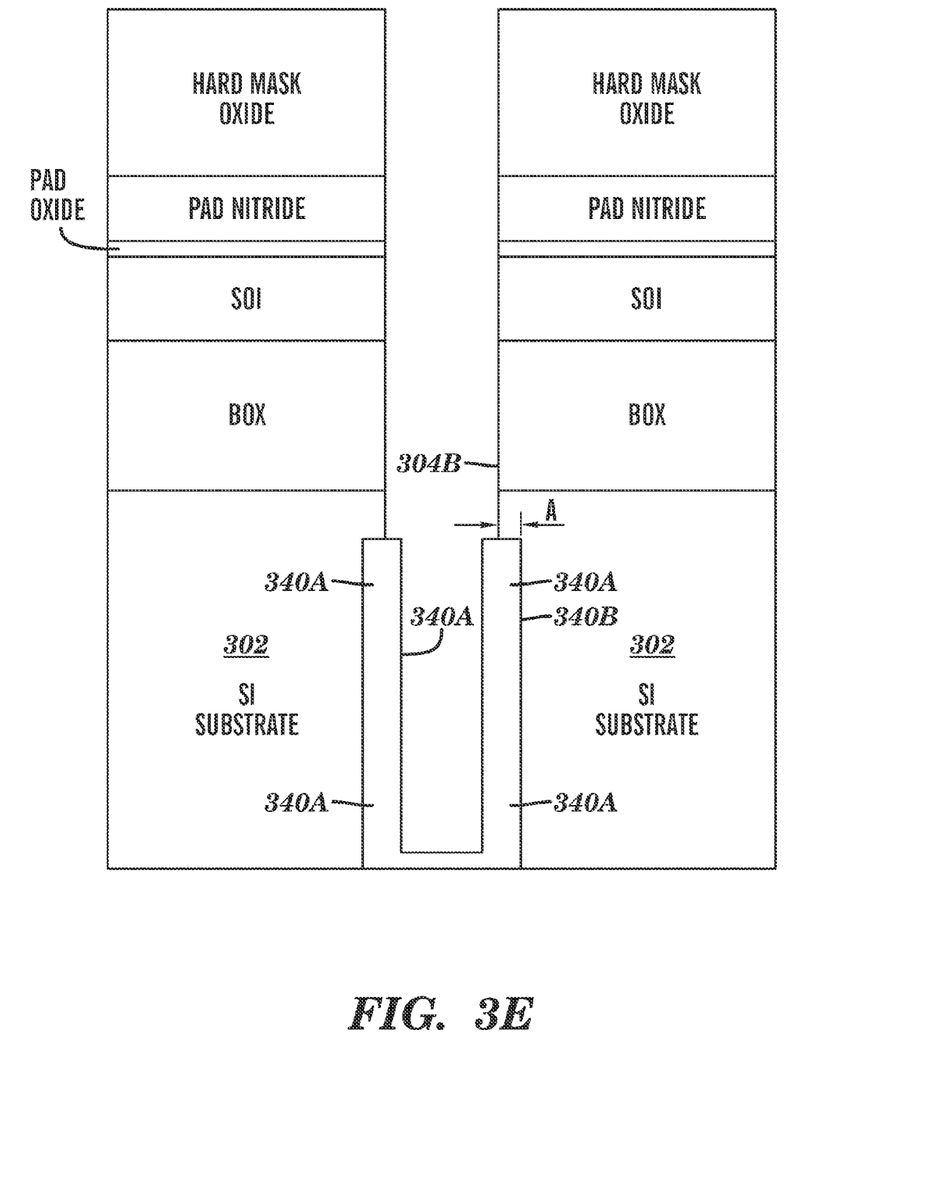

In FIG. 3E, the unreacted metal 340 is removed—i.e. from regions where it was deposited on the spacer 330. Removal is accomplished by any well known technique such as a selective wet etching proves that does not attack the silicide 340A.

The continuous spacer 330 is then removed by any conventional wet chemistry process that uses HF as base. The resulting structure is shown in the schematic cross-sectional diagram of FIG. 3E.

Figure 3F:
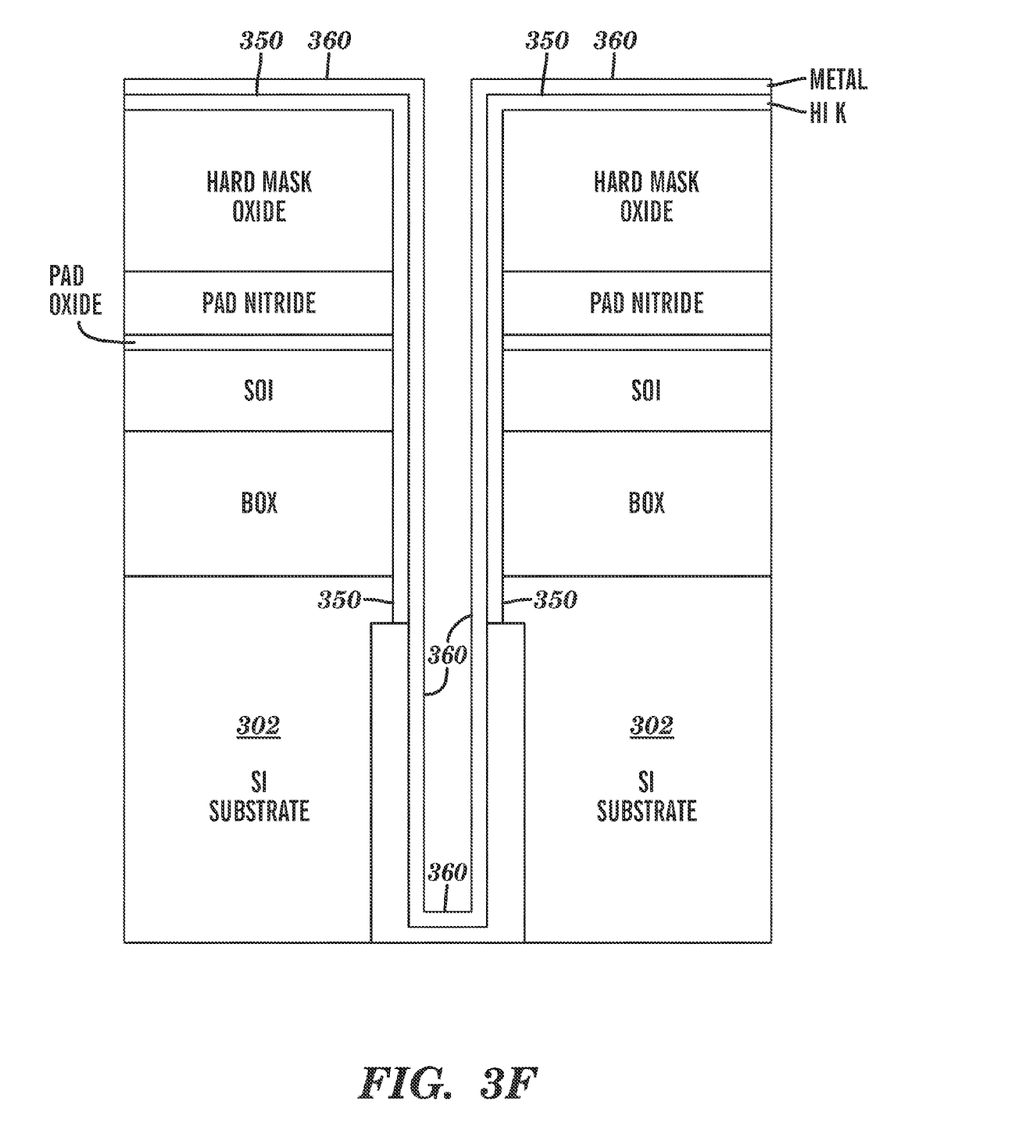

Thereafter, a layer 350 of a high-k dielectric material is deposited throughout the inside of the deep trench, and thus onto the silicide 340A. The high-k dielectric material can be ZrO, AlOx, HfOx, HfSiOx, ZrAlOx, TiOx, Ta2O5, Strontium Titanium Oxide or a combination of these materials, and can be conventionally deposited by any of the following techniques: Atomic layer deposition or chemical vapor deposition. The layer can have a substantially uniform thickness in a range of approximately 4 nm to approximately 20 nm. See FIG. 3F. In FIG. 3F, for ease of explanation, the layer 340A is not shown extending into the DT 320, although it is understood to be present within the trench shown in FIG. 3E. A second conformal layer 360 of a conductive material is then deposited onto the layer 350. The material of the layer 360 can be a metal such as TiN, TaN, TiAlN, Pt, Pd, Ru, RuOx, Ti, TiSiN or a combination of these materials, and can be deposited by conventional techniques such as atomic layer deposition and chemical vapor deposition. The layer 360 can function primarily as the second electrode for the capacitor. Subsequent conventional processing steps (not shown) can then be performed such as formation of buried strap, logic and higher level Cu, W and Al metallization contacts, all not shown.

Figure 4:
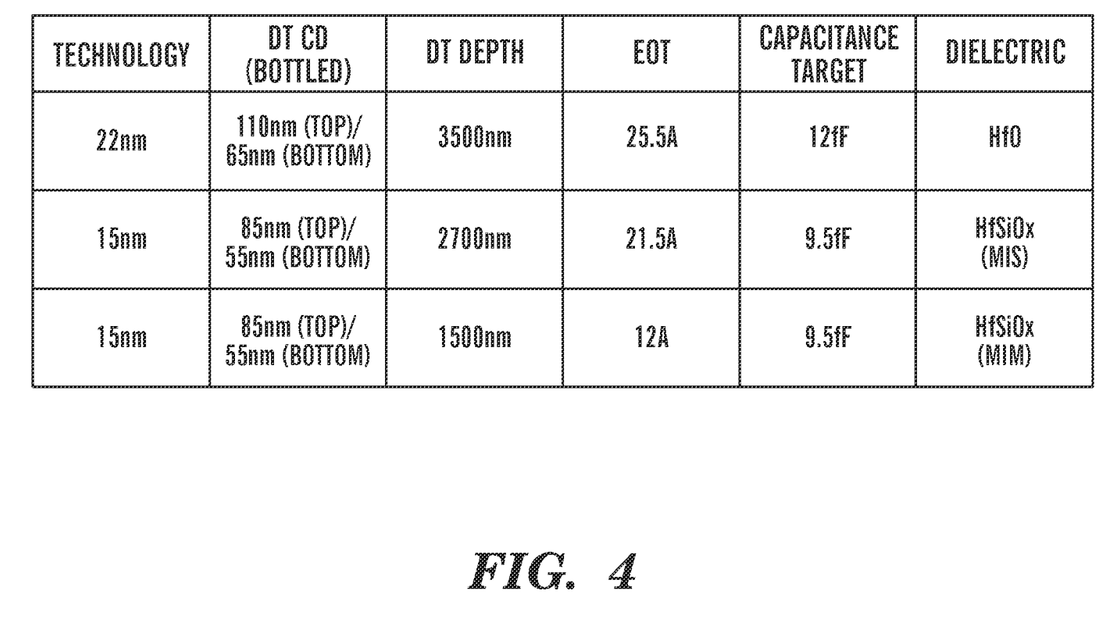
FIG. 4 is a chart showing additional parameters for embodiments of the present invention.

FIG. 4 is a chart showing various preferred parameters for embodiments of the present invention. The chart lists approximate parameters for the technology nodes—22 nm and 15 nm.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method, comprising:
providing an SOI substrate including a layer of silicon disposed atop a layer of an oxide, the layer of an oxide being disposed atop a semiconductor substrate;
forming a deep trench having a sidewall extending through the layer of silicon and the layer of an oxide and into the substrate;
depositing a continuous spacer on the sidewall to cover the layer of silicon, the layer of an oxide and a part of the substrate;
depositing a first conformal layer of a conductive material throughout the inside of the deep trench;
creating a silicide within the deep trench in regions extending through the sidewall into an uncovered part of the substrate;
removing the first conformal layer from the continuous spacer;
removing the continuous spacer;
depositing a layer of a high k dielectric material throughout the inside of the deep trench, and
depositing a second conformal layer of a conductive material onto the layer of a high-k dielectric material.

2. The method as claimed in claim 1, wherein said step of depositing a continuous spacer includes depositing a continuous spacer consisting essentially of a nitride material.

3. The method as claimed in claim 1, wherein the spacer has a approximately uniform thickness in a range of approximately five nm to approximately 11 nm.

4. The method as claimed in claim 1, wherein said step of depositing a first conformal layer of a conductive material includes atomic layer depositing the first conformal layer.

5. The method as claimed in claim 4, wherein the conductive material comprises a metal selected from a group consisting of Ti, Ni, Co, Pt and Pd.

6. The method as claimed in claim 1, further comprising: depositing a layer of an oxide onto the layer of silicon, and depositing a layer of a nitride material onto the layer of oxide, prior to said step of providing an SOI substrate.

7. The method as claimed in claim 6, further comprising: depositing a hard mask onto the layer of a nitride material, the hard mask consisting essentially of an oxide material.

8. The method as claimed in claim 1, wherein the high-k dielectric material is a material selected from a group consisting essentially of HfO2, ZrO2, AlOx, HfAlOx, ZrAlOx, Ta2O5, TiO2, SrTiOx, or a combination of the materials.

9. The method as claimed in claim 1, wherein the deep trench has a depth into the substrate of approximately 1500 nm to approximately 5000 nm.

10. The method as claimed in claim 1, wherein the continuous spacer has an approximately uniform thickness in a range of approximately 3 nm to approximately 30 nm.

11. The method as claimed in claim 1, wherein the layer of a high-k dielectric material has an approximately uniform thickness in a range of approximately 4 nm to approximately 20 nm.

12. The method as claimed in claim 1, wherein the silicide extends approximately 5 nm into the uncovered part of the SOI substrate.

13. The method as claimed in claim 1, wherein the second conformal layer includes a conductive material selected from a group consisting essentially of TiN, TaN, TiAlN, Pt, Pd, Ru, RuOx, Ti, TiSiN or a combination of these materials.

14. The method as claimed in claim 1, wherein the second conformal layer of a conductive material has an approximately uniform thickness in a range of approximately 4 nm to approximately 20 nm.

15. The method as claimed in claim 14, wherein the conductive material of the second conformal layer is a metal.

16. The method as claimed in claim 1, wherein the first conformal layer of a conductive material has an approximately uniform thickness in a range of approximately 1 nm to approximately 15 nm.

17. The method as claimed in claim 1, wherein the deep trench has an approximately uniform width in a range of approximately 20 nm to approximately 120 nm.

* * * * *